United States Patent
Tuma et al.

(10) Patent No.: US 7,695,808 B2
(45) Date of Patent: *Apr. 13, 2010

(54) THERMAL TRANSFER COATING

(75) Inventors: Phillip E. Tuma, Faribault, MN (US); Gary M. Palmgren, Lake Elmo, MN (US)

(73) Assignee: 3M Innovative Properties Company, St. Paul, MN (US)

(*) Notice: Subject to any disclaimer, the term of this patent is extended or adjusted under 35 U.S.C. 154(b) by 1192 days.

This patent is subject to a terminal disclaimer.

(21) Appl. No.: 11/268,140

(22) Filed: Nov. 7, 2005

(65) Prior Publication Data

US 2007/0102070 A1    May 10, 2007

(51) Int. Cl.
- B32B 5/16 (2006.01)
- F24H 9/02 (2006.01)
- B05D 3/02 (2006.01)

(52) U.S. Cl. .............. 428/328; 428/32.74; 428/323; 428/403; 165/80.2; 165/80.4; 165/80.5; 165/128; 165/129; 165/185; 427/331; 427/372.2; 427/375

(58) Field of Classification Search ............ 428/32.74, 428/323, 328, 403; 165/80.2, 80.3, 80.4, 165/80.5; 427/331, 372.2, 375

See application file for complete search history.

(56) References Cited

U.S. PATENT DOCUMENTS

| | | | |
|---|---|---|---|
| 3,384,154 A | 5/1968 | Milton | |
| 3,523,577 A | 8/1970 | Milton | |
| 3,587,730 A | 6/1971 | Milton | |
| 3,689,346 A | 9/1972 | Rowland | |
| 3,753,757 A | 8/1973 | Rodgers et al. | |
| 3,821,018 A | 6/1974 | Grant | |
| 3,990,862 A | 11/1976 | Dahl et al. | |
| 4,064,914 A | 12/1977 | Grant | |
| 4,129,181 A | 12/1978 | Janowski et al. | |
| 4,182,412 A | 1/1980 | Shum | |
| 4,232,056 A | 11/1980 | Grant et al. | |
| 4,354,550 A | 10/1982 | Modahl et al. | |
| 4,381,818 A | 5/1983 | Sachar et al. | |
| 4,663,243 A | 5/1987 | Czikk et al. | |
| 4,890,669 A | 1/1990 | Zohler | |
| 5,570,502 A | 11/1996 | Sawtell et al. | |
| 5,814,392 A | 9/1998 | You et al. | |

(Continued)

FOREIGN PATENT DOCUMENTS

EP    0 786 506 A1    7/1997

(Continued)

OTHER PUBLICATIONS

Encyclopedia of Polymer Science and Technology, vol. 8, John Wiley & Sons, Inc. (1968) p. 651-665.

*Primary Examiner*—Mark Ruthkosky
*Assistant Examiner*—David J Joy
(74) *Attorney, Agent, or Firm*—Daniel D. Biesterveld; James A. Baker (57) ABSTRACT

Thermal transfer coating comprising a plurality of metal bodies and a plurality of interstitial elements disposed between and connecting the plurality of metal bodies to one another. The metal bodies comprise an inner portion comprising a first metal and an outer portion comprising an alloy comprising the first metal and a second metal. The interstitial elements comprise the alloy of the outer portion.

39 Claims, 4 Drawing Sheets

U.S. PATENT DOCUMENTS

| | | |
|---|---|---|
| 6,397,450 B1 | 6/2002 | Ozmat |
| 6,896,039 B2 | 5/2005 | Dussinger et al. |
| 7,109,581 B2 | 9/2006 | Dangelo et al. |
| 7,124,809 B2 | 10/2006 | Rosenfeld et al. |
| 7,360,581 B2 * | 4/2008 | Tuma et al. ............... 165/80.3 |
| 2002/0192488 A1 | 12/2002 | Kurihara et al. |
| 2004/0003619 A1 | 1/2004 | Lee et al. |
| 2004/0186203 A1 | 9/2004 | Koyanagi |
| 2005/0095189 A1 | 5/2005 | Brey et al. |
| 2007/0035927 A1 | 2/2007 | Erturk et al. |

FOREIGN PATENT DOCUMENTS

| | | |
|---|---|---|
| JP | 57-164292 | 3/1984 |
| JP | 61-273253 | 12/1986 |
| JP | 10-062096 | 3/1998 |
| JP | 2004-300415 | 10/2004 |
| KR | 10-1999-0050184 | 6/2001 |
| KR | 10-2004-0005108 | 1/2004 |
| WO | WO 94/01029 | 1/1994 |

\* cited by examiner

THERMAL TRANSFER COATING

FIELD OF INVENTION

The present invention relates generally to a thermal transfer coating. More particularly, the present invention relates to porous metallic coatings and methods of making and using the same.

BACKGROUND

One cooling system for heat-dissipating components comprises fluids that evaporate or boil. The vapor produced is then condensed using external means and returned back to the boiler. To improve heat transfer of the fluid at the boiler, a porous boiling surface can be used.

A variety of porous boiling surfaces are available, including, for example, coatings made by flame or plasma spraying. With these processes, it can be difficult to control porosity and evenly coat three-dimensional substrates. Other known coatings comprise conductive particles joined with organic binders. These coatings generally have poor bulk thermal conductivity and therefore require precise thickness control that is difficult on substrates with three-dimensional surfaces.

As integrated circuits and other heat dissipating electronic devices become more powerful and compact, the rate of heat transfer away from these heat-dissipating components needs to be increased. Accordingly, there is a continuing need to develop porous boiling surfaces with high heat transfer coefficients. Further, there is a continuing need for inexpensive porous boiling surfaces that can be easily applied in a manufacturing process.

SUMMARY

The present invention relates generally to a thermal transfer coating. More particularly, the present invention relates to porous metallic coatings and methods of making and using the same. The coatings can be used to make evaporators for cooling devices such as refrigeration systems and electronic cooling systems. The coatings can be used in both single or two phase heat transfer systems. In some embodiments, the coating is applied to a boiler of a thermosyphon used to cool an integrated circuit such as, for example, a microprocessor.

In one aspect, the present disclosure provides a thermal transfer coating comprising a plurality of metal bodies and a plurality of interstitial elements disposed between and connecting the plurality of metal bodies to one another. The metal bodies comprise an inner portion comprising a first metal selected from the group consisting of aluminum, copper, silver, and alloys thereof, and an outer portion comprising an alloy comprising the first metal and a second metal selected from the group consisting of copper, silver, and magnesium. The interstitial elements comprise the alloy of the outer portion, and the thermal transfer coating has an effective porosity of at least 10 percent.

In some embodiments, the first metal comprises copper, the second metal comprises silver, and the interstitial elements comprise an alloy of silver and copper. In other embodiments, the first metal comprises aluminum, the second metal comprises magnesium, and the interstitial elements comprise an alloy of aluminum and magnesium.

In some aspects, the metal bodies comprise diamond in their inner portion. In addition to the first metal, the diamonds can be coated with an intermediate coating comprising a carbide former selected from the group consisting of chromium, cobalt, manganese, molybdenum, nickel, silicon, tantalum, titanium, tungsten, vanadium, zirconium, and alloys thereof.

In another aspect, the present disclosure provides methods for forming thermal transfer coatings. The methods include providing a heat-dissipating substrate having an outer surface and depositing a composition comprising a thermally removable binder and a plurality of metal bodies onto the heat-dissipating substrate. The metal bodies comprise an inner portion comprising a first metal having a melting temperature $T_{mp1}$, and an outer portion comprising a second metal having a melting temperature $T_{mp2}$. The composition is then heated to a temperature less than $T_{mp1}$ and $T_{mp2}$ to form an alloy comprising the first metal and the second metal that bonds said plurality of metal bodies to one another and the heat-dissipating substrate. This process is referred to as isothermal re-solidification.

In another aspect, methods for cooling heat-dissipating devices using thermal transfer coatings of the present disclosure are provided.

In the context of the present disclosure:

The term "effective porosity" refers to the interconnected pore volume or void space in a body that contributes to fluid flow or permeability in a matrix. Effective porosity excludes isolated pores that may exist in the matrix.

The term "unit density" refers to the quantity of designated units per a specified volume. For example, if a porous matrix as described in the present disclosure comprises 100 metal bodies and occupied a volume of 1 cubic centimeter, the unit density of the metal bodies would be 100 metal bodies per cubic centimeter The term "aspect ratio" refers to the ratio of the longest dimension of a three-dimensional body (i.e., "overall length") and the longest dimension orthogonal to the overall length dimension (i.e., "overall width").

The term "substantially spherical" refers to three-dimensional body having an aspect ratio between about 1 and 1.5 and a generally spherical shape.

The term "three-dimensional surface" refers to a surface having raised portions and recessed portions that have a height differential of at least 0.1 millimeter. The transition from the recessed portion to the raised portions can be gradual or abrupt. The boiler 10 in FIG. 1, for example, includes a three-dimensional surface with relatively abrupt transitions between the recessed portions and the raised portions formed by fins 20.

The above summary of the present disclosure is not intended to describe each disclosed embodiment of every implementation of the thermal transfer coating of the present disclosure. The Figures and the detailed description that follow more particularly exemplify illustrative embodiments. The recitation of numerical ranges by endpoints includes all numbers subsumed with that range (e.g., 1 to 5 includes 1, 1.5, 2, 2.75, 3, 4, 4.80, and 5).

These figures, which are idealized, are not to scale and are intended to be merely illustrative of the thermal transfer coatings of the present disclosure and are non-limiting.

DETAILED DESCRIPTION

Figure 1:
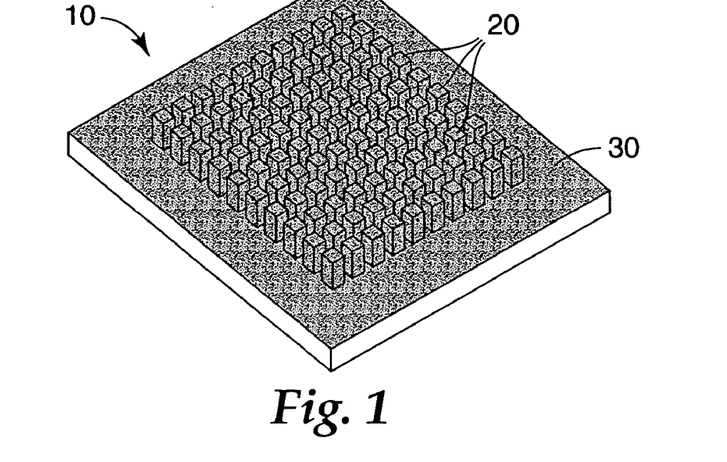
FIG. 1 is a perspective view of a boiler having a thermal transfer coating of the present disclosure.

FIG. 1 is a perspective view of a boiler 10 having a thermal transfer coating 30 of the present disclosure. As shown in FIG. 1, the thermal transfer coating can be applied to a boiler 10 having a three-dimensional surface. The three-dimensional surface can include an array of projections, such as fins 20, or other structures that increase the surface area of the boiler.

Figure 2A:
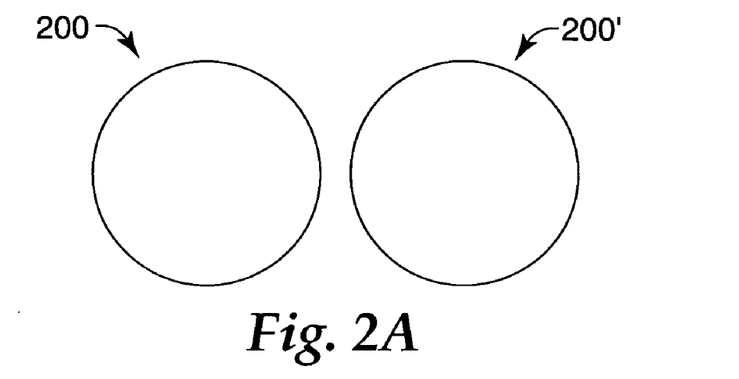
FIG. 2A is a side view of two exemplary precursor metal bodies used to make thermal transfer coatings of the present disclosure.
Figure 2B:
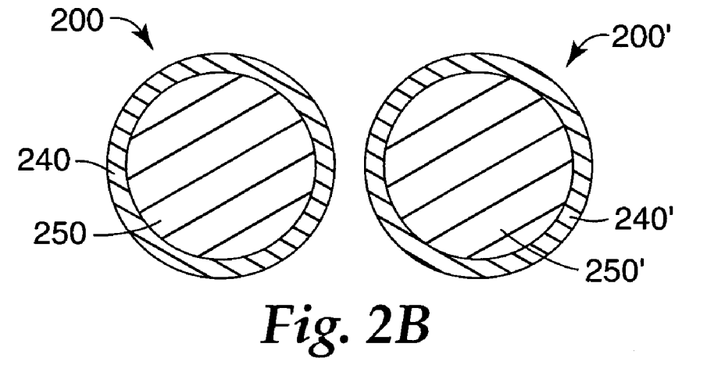
FIG. 2B is a cross-sectional view of the two exemplary precursor metal bodies shown in FIG. 2A.
Figure 2C:
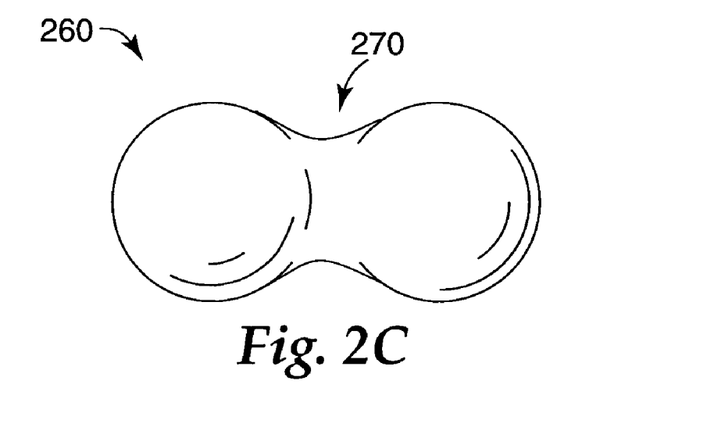
FIG. 2C is a side view of the two exemplary metal bodies shown in FIG. 2A after an interstitial element is formed to attach the two bodies together using methods of the present disclosure.

FIGS. 2A-2C illustrate the sequence by which the thermal transfer coating of the present disclosure is formed. The figures are a simplified representation showing two exemplary precursor metal bodies being joined. The thermal transfer coatings of the present disclosure typically are formed from large numbers of precursor metal bodies that join together in a three-dimensional porous matrix.

FIG. 2A is a side view of two exemplary precursor metal bodies used to make thermal transfer coatings of the present disclosure. As shown in FIG. 2A, the precursor metal bodies 200, 200' can be about the same size. In other embodiments, the precursor metal bodies can vary in size. The precursor metal bodies can be substantially spherical as shown in FIG. 2A.

The precursor metal bodies that are useful for making coatings in accordance with the present disclosure typically have an average diameter of at least 1 micrometer. In some embodiments, the precursor metal bodies have an average diameter of at least 5 micrometers. In yet further embodiments, the precursor metal bodies have an average diameter of at least 10 micrometers.

The precursor metal bodies that are useful for making coatings in accordance with the present disclosure typically have an average diameter no greater than 1,000 micrometers. In some embodiments, the precursor metal bodies have an average diameter no greater than 500 micrometers. In yet further embodiments, the precursor metal bodies have an average diameter no greater than 50 micrometers.

Some embodiments use precursor metal bodies having an aspect ratio in the range of 1 to 2. In other embodiments, the precursor metal bodies are oval shaped and have an aspect ratio greater than 1.5. In yet further embodiments, the precursor metal bodies can be polyhedrons (e.g., cubo-octohedral) or other randomly shaped bodies, including, for example, flake, chip, fiber, plate, cylinder, and needle-shaped bodies. If the precursor metal bodies are non-spherical, the "diameter" of the body refers to the dimension of the smallest axis in each body, and the "average diameter" refers to the average of the individual body diameters (i.e., dimension of smallest axis in each body) in the population.

FIG. 2B is a cross-sectional view of the two exemplary precursor metal bodies 200, 200' shown in FIG. 2A. As shown in FIG. 2B, each precursor metal body comprises an inner portion 250, 250', and an outer portion 240, 240'. In some embodiments, the inner portion 250, 250' comprises a metal selected from the group consisting of aluminum, copper, silver, and alloys thereof. In some embodiments, the outer portion 240, 240' comprises a metal selected from the group consisting of copper, silver, magnesium, and alloys thereof. In yet further embodiments, the inner portion has a metal having a melting temperature $T_{mp1}$, the outer portion has a metal having a melting temperature $T_{mp2}$, and upon heating to a temperature less than $T_{mp1}$ or $T_{mp2}$, an alloy is formed comprising the metals of the inner and outer portions. In some embodiments, the metals in the inner and outer portion of the precursor metal bodies are selected based upon their thermal conductivity and/or their alloy forming characteristics.

In some embodiments, the outer portion is uniformly applied to the inner portion such that the outer portion has a uniform thickness. In other embodiments, the thickness of the outer coating can vary. In some preferred embodiments, the outer portion covers a majority of the outer surface of the inner portion. In some embodiments, the outer portion covers more than 90 percent of the outer surface of the inner portion. In yet further embodiments, the outer portion covers the outer surface of the inner portion completely.

The amount of material used to form the outer portion can be expressed in terms of relative weight or thickness. For example, in some embodiments, the outer portion comprises about 1 percent by weight of the metal body precursor. The outer portion typically comprises between about 0.05 and 30 percent by weight of the metal body precursor. In other embodiments, the outer portion has an average thickness in the ranges of 0.001 to 0.5 micrometers. In some embodiments, the outer portion has an average thickness in the range of 0.01 to 0.05 micrometers.

An exemplary useful precursor metal body having a copper inner portion and silver outer portion is available as "SILVER COATED COPPER POWDER #107" from Ferro Corp. (Plainfield, N.J.). Other useful precursor metal bodies include, for example, aluminum particles coated with magnesium. The precursor metal bodies can be formed using any methods known to those in the art, including, for example, physical vapor deposition (see, e.g., U.S. Pat. App. Pub. 2005/0095189 A1 (Brey et al.)), plasma deposition, electroless plating, electrolytic plating, or immersion plating.

FIG. 2C is a side view of the two exemplary precursor metal bodies 200, 200' shown in FIGS. 2A and 2B joined together to form structure 260. As shown in FIG. 2C, an interstitial element 270 is formed to attach the two bodies together using methods of the present disclosure. The interstitial element 270 is formed by subjecting the precursor metal bodies to an elevated temperature such that the metals of the inner and outer portions of the precursor metal bodies form an alloy that bonds the bodies together. This process is known as isothermal re-solidification. In some embodiments, a eutectic is formed that has a lower melting point than the individual metals that form the alloy. The formation of the eutectic may be temporary as diffusion during the isothermal re-solidification process can cause continuous change in the composition of the interfaces of the various metals. In some embodiments, the isothermal re-solidification process occurs in a reducing or vacuum furnace, such as, for example, a VCT model vacuum furnace available from Hayes of Cranston, R.I.

Figure 4:
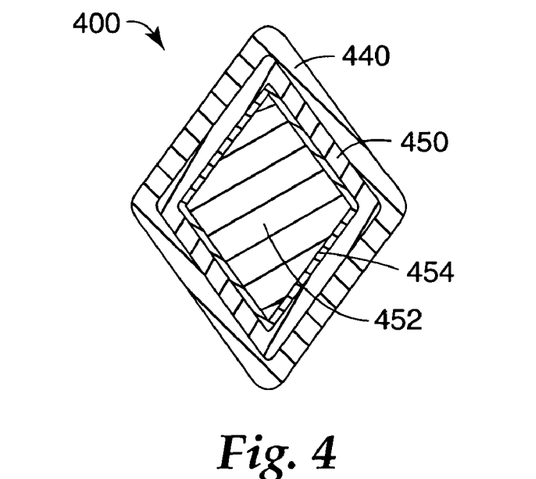
FIG. 4 is a cross-sectional view of an exemplary precursor metal body comprising a coated diamond.

FIG. 4 is a cross-sectional view of an exemplary precursor metal body comprising a coated diamond in the inner portion. As shown in FIG. 4, the inner portion of the precursor metal body comprises a diamond 452, an intermediate coating 454, and the first metal 450. The outer portion 440 comprises the second metal. The intermediate coating that coats the diamond can comprise any known carbide former, including, for example, chromium, cobalt, manganese, molybdenum, nickel, silicon, tantalum, titanium, tungsten, vanadium, zirconium, and alloys thereof. The intermediate coating can be applied to the diamond using any techniques known in the art, including, for example, physical vapor deposition, chemical vapor deposition, molten salt deposition (see, e.g., EP 0 786 506 A1 (Karas et al.)), electrolysis in molten salt, and mechanical plating. In some embodiments, the intermediate coating that coats the diamond comprises multiple layers.

Although not wishing to be bound by any theory, the thermal conductivity of the encapsulated diamonds is believed to enhance the performance of the thermal transfer coating. In some embodiments, diamonds (coated or uncoated) can be combined with the plurality of precursor metal bodies (with or without internal diamonds) to form a thermal transfer coating having a mixture of metal bodies and diamonds held together with interstitial elements. Other materials can also be encapsulated or combined with the metal bodies, including, for example, polycrystalline diamonds, synthetic diamond, polycrystalline diamond compacts (PDC), isotopically pure diamond, and combinations thereof.

As discussed above, FIGS. 2A-2C are a simplified representation showing two exemplary precursor metal bodies being joined. The thermal transfer coatings of the present disclosure typically are formed from large numbers of precursor metal bodies that join together in a three-dimensional porous matrix. Each of the metal precursor metal bodies can join to 1, 2, 3, 4, 5, or more other metal precursor metal bodies to form the three-dimensional porous matrix.

Figure 3:
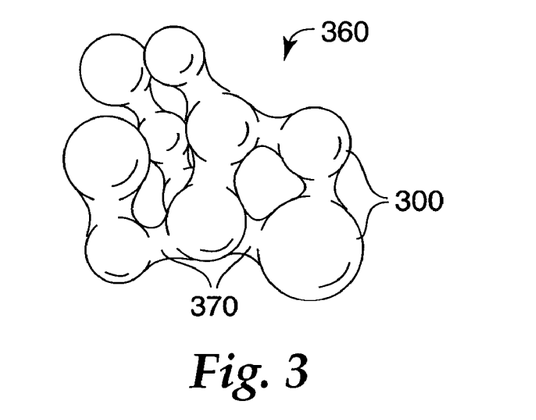
FIG. 3 is an exemplary perspective view of a portion of an exemplary thermal transfer coating of the present disclosure.

FIG. 3 is an exemplary perspective view of a portion of an exemplary thermal transfer coating of the present disclosure (substrate not shown). As shown in FIG. 3, the thermal transfer coating 360 comprises a plurality of metal bodies 300 connected to one another with interstitial elements 370 to form a three-dimensional porous matrix. The interstitial elements 370 can also bond a metal body 300 to a substrate.

In some embodiments, the thermal transfer coating of the present disclosure has a metal body density in the range of about $10^6$ to $10^{11}$ metal bodies per cubic centimeter. In some embodiments, the thermal transfer coating of the present disclosure has a metal body density in the range of about $10^7$ to $10^9$ metal bodies per cubic centimeter.

The porosity of the thermal transfer coating of the present disclosure is typically in the range of 10 to 60 percent. In some embodiments, the porosity of the thermal transfer coating is at least 20 percent. In yet further embodiments, the porosity of the thermal transfer coating is at least 30 percent.

The alloy used to form the interstitial elements 370 can also facilitate attachment of the thermal transfer coating 360 to a substrate. In some embodiments, the substrate has a metal surface that comprises at least one of the metals used to form the alloy that forms the interstitial elements. In some embodiments, for example, the substrate comprises copper, the inner portion of the precursor metal bodies comprise copper, the outer portion of the precursor metal bodies comprise silver, and the interstitial elements that are formed comprise an alloy of copper and silver wherein at least a portion of the interstitial elements that bond some of the metal bodies to the substrate comprise copper derived from the substrate.

The precursor metal bodies can be arranged on the substrate using any known techniques for positioning bodies to fabricate three-dimensional porous matrices, including, for example, gravity, molds, and binders (e.g., thermally removable binders). In some embodiments, a thin layer of precursor metal bodies is placed on a substantially level surface and heated to form the thermal transfer coating. In other embodiments, a perimeter wall (i.e., mold) can be used to retain the precursor metal bodies prior to and during the isothermal re-solidification step. In yet further embodiments, a binder is used to position the precursor metal bodies prior to and during the isothermal re-solidification step.

The binder can be any known binder that sufficiently adheres the precursor metal bodies together prior to and during isothermal re-solidification process. Useful binders include mineral oil, silicone oil, kerosene, and polyvinyl butyral. In some preferred embodiments, the binder burns off during the re-solidification process and is substantially removed from the resulting thermal transfer coating. The binder may be selected to form a slurry having a paste-like consistency. In some embodiments, the binder is selected to allow the precursor metal bodies to be positioned on the various planes of a three-dimensional surface, including, for example, vertical planes.

In some embodiments, a mixture of oil available as "DOW CORNING 704 DIFFUSION PUMP FLUID" from Dow-Corning Corp. (Midland, Mich.), and fluid available as "NOVEC ENGINEERED FLUID HFE-72DE" from 3M Co. (St. Paul, Minn.), is used as a binder. The mixture can be sprayed onto a surface using, for example, an artist air brush. After applying the mixture, precursor metal bodies can be introduced to the wetted surface. The process can be repeated until the desired thickness is achieved.

The thermal transfer coatings of the present disclosure typically have an average thickness in the range of 20 to 1,000 micrometers. In some embodiments, the thermal transfer coating has an average thickness in the range of 50 to 500 micrometers.

The thermal transfer coating of the present disclosure can be used in cooling systems, such as, for example, a thermosyphon. The thermal transfer coating can be applied directly to the heat-generating device or a heat-dissipating device in thermal communication with the heat-generating device.

The thermal transfer coating of the present disclosure typically have a heat transfer coefficient of at least 3 watts per square centimeter per degree Celsius at a heat flux of at least 10 watts per square centimeter. In some embodiments, the thermal transfer coating of the present disclosure have a heat transfer coefficient of at least 6 watts per square centimeter per degree Celsius at a heat flux of at least 10 watts per square centimeter.

Advantages and other embodiments of the thermal transfer coating of the present disclosure are further illustrated by the following examples, but the particular materials and amounts thereof recited in these examples, as well as other conditions and details, should not be construed to unduly limit the thermal transfer coating of the present disclosure. For example, the metals used to form the precursor metal bodies can vary. All parts and percentages are by weight unless otherwise indicated.

| Coating Materials | | |
|---|---|---|
| Coating Material | Description | Source |
| A | Silver coated copper powder containing 10 weight percent silver with 90 percent of the particles less than 15 micrometers | # 107, from Ferro Corporation, South Plainfield, NJ |

-continued

Coating Materials

| Coating Material | Description | Source |
|---|---|---|
| B | 40 micrometer diamond | SMB-5A Mesh 325-400, National Research Company, Chesterfield, MI |
| C | Sub 325 Mesh copper particles sputter coated with silver using a process described in U.S. Patent Application Publication 2005/0095189 A1. The resultant particles contained 0.4-0.9 weight percent silver. | #CU-112, Atlantic Equipment Engineers, Bergenfield, NJ, Silver available from Academy Precision Materials, Albuquerque, NM |
| D | Sub-20 micrometer particles of C collected using a 625 mesh sieve | |
| E | The particles not collected in D produced a mixture of particles predominately between 625 mesh (20 micrometer) and 325 Mesh (44 micrometer). | |
| F | 15-25 micrometer copper coated diamond coated with silver as described in C. | Diamond Innovations, Worthington OH |

Coatings were prepared and boiling experiments were conducted using the methods described below.

Test Methods

Pool Boiling 1

Test disks were made of flat, 54 millimeter diameter stamped copper disks 2 millimeter thick. The central 28 millimeter diameter region of one surface of these disks was generally coated as follows. The copper surface to be coated was first cleaned with a sulfuric acid solution to remove residual oxide then rinsed with water followed by acetone and then dried. If needed, the part was masked using a stencil to limit the coating to a particular region.

An artist's air brush was used to spray the test disk surface with a 50 percent mixture of Dow 704 diffusion pump oil in 3M NOVEC ENGINEERED FLUID HFE-72de. This mixture was applied until the surface was uniformly wetted. The surface was then dusted with the particles or a particle mixture until the oil was saturated and excess particles shed easily. This coating step was repeated as needed to achieve the desired thickness. Each step added roughly 80 micrometer to the coated thickness.

The coated copper disks were put into a vacuum furnace. The pressure was reduced to below 0.001 millimeters of mercury while the furnace temperature was raised at about 14 degree Celsius per minute to 300 degree Celsius and held at 300 degree Celsius for 15 minutes to remove the oil. The furnace was then heated to 850 degree Celsius at about 14 degree Celsius per minute and then allowed to cool to near room temperature before the vacuum was broken and the part removed.

An apparatus was built to permit rapid testing of many test disks. The apparatus comprised a copper pedestal heater with a square copper base 31.8 millimeter by 31.8 millimeter and 3.0 millimeter high and a round raised region 28.5 millimeter in diameter that projected 3.0 millimeter from one surface of the square base. The flat surface of the round projection was lapped flat and polished. A 25.4 millimeter by 25.4 millimeter Kapton Heater (Minco HK5318 R7.6 L24 E) was attached to the exposed surface of the square base using thermally conductive epoxy (3M Scotch-Weld DP 460-EG A11, available from 3M Company, St. Paul, Minn.).

The heater was cast in a silicone rubber compound, which formed a disk of 55 millimeter in diameter and 13 millimeter high. The top surface of the silicone is flush with the lapped surface of the heater. A small thermocouple placed atop the silicone, 2 millimeter from the outer diameter of the copper heater, was used to measure the test disk or wall temperature, $T_w$.

To mount a test surface, a small quantity of silver grease was first applied to the heater surface. A test disk was then placed atop the silicone and the greased heater surface such that the disk pressed on the thermocouple. A 28 millimeter inside diameter glass tube bearing a PTFE gasket was clamped atop the test disk sealing to its periphery. About 20 milliliters of 3M NOVEC ENGINEERED FLUID HFE-7000 (available from 3M Company, St. Paul, Minn.) was then added though the open top of the tube. A water-cooled condenser coil was inserted into the top of the tube. A thermocouple in the region between the bottom of the copper coil and the top of the meniscus of the fluid was used to measure the fluid saturation temperature, $T_{sat}$.

An automated data acquisition system applied DC voltage, V, to the heater. This voltage began at 4 VDC and progressed at 2 VDC increments every 3 minutes until the voltage exceeded a preset limit. Each data point was logged before progressing to the next by averaging 100 temperature measurements. The heat flux to the heater, Q″, was logged as the average voltage squared divided by the heater resistance at its maximum temperature, R, divided by the area of the coated surface of the test disks:

$$Q'' = \frac{4V^2}{R \pi D^2}$$

The heat transfer coefficient, H, was then calculated as $$H = \frac{Q''}{T_w - T_{sat}}$$

Pool Boiling 2

Test disks were made of 5.8 cm diameter machined copper disks 0.317 cm thick. One surface of these disks contained a 1 millimeter thermocouple groove machined to a depth of about 2 millimeter and terminating at the disk centerline. The central 2.54 centimeter diameter of the opposite surface was the coating surface. The test disks were coated and fused as described above.

This test method was similar to that described for Pool Boiling 1 except that the test disk temperature, $T_w$ was measured with a thermocouple embedded in the aforementioned thermocouple groove within the disk. Also, the heater was constructed to deliver a uniform heat flux to a circular region 2.54 cm diameter. The test disks were clamped as before with silver grease in the interface between heater and test disk. Also, these tests were not terminated at a preset voltage but instead were allowed to run until the difference between the disk temperature and saturation temperature exceeded 20 degrees Celsius, indicating that the surface had dried out and could no longer sustain boiling (Critical Heat Flux, CHF).

Two Phase Forced Convection

The thermal transfer article of the present disclosure can also be used with conventional forced convection techniques to create articles that dissipate much higher heat fluxes. To demonstrate, a copper heater was built that could deliver up to 100 watts to a flat surface 1 millimeter by 10 millimeter that simulates the power dissipated by a laser diode array. A thermocouple 1 millimeter from the heated surface permitted calculation of the heater surface temperature. A heat exchanger was soldered to this heat source. The heat exchanger comprised the soldered surface, which consisted of 0.010 inch thick sheet of copper. A 1 millimeter by 10 millimeter by 0.76 millimeter thick porous matrix was fused to the copper sheet directly opposite the soldered or heated surface. A manifold plate was bonded to the top of this thermal transfer article and to the edges of the copper sheet to allow 3M NOVEC ENGINEERED FLUID HFE-7000 to be forced through and only through the porous matrix from one 10 millimeter by 0.76 millimeter surface to the other. The pressure difference applied was measured by measuring the height of the fluid column at the inlet manifold port.

EXAMPLES

Figure 5:
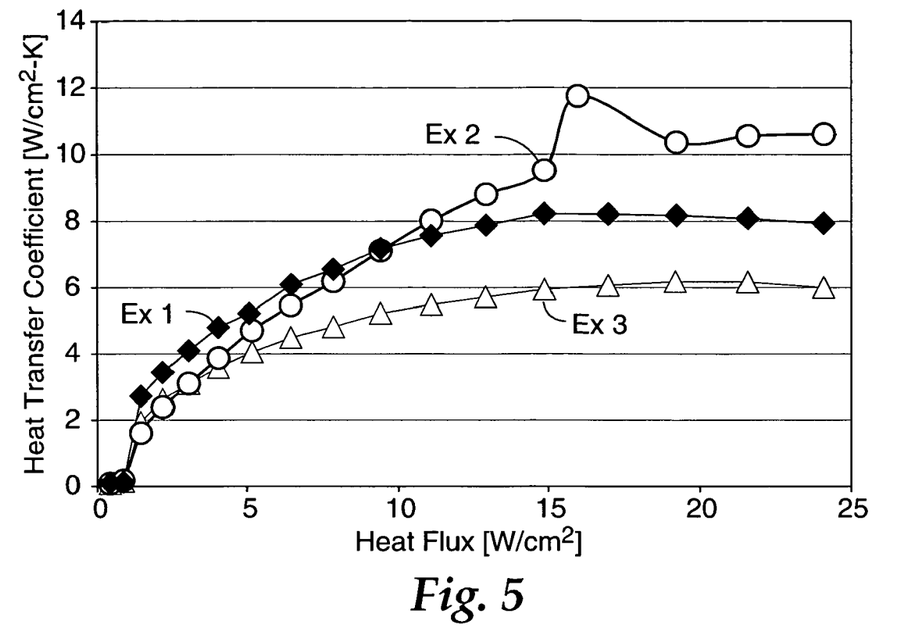
FIGS. 5-7 are graphs showing the experimental results of exemplary embodiments.
Figure 6:
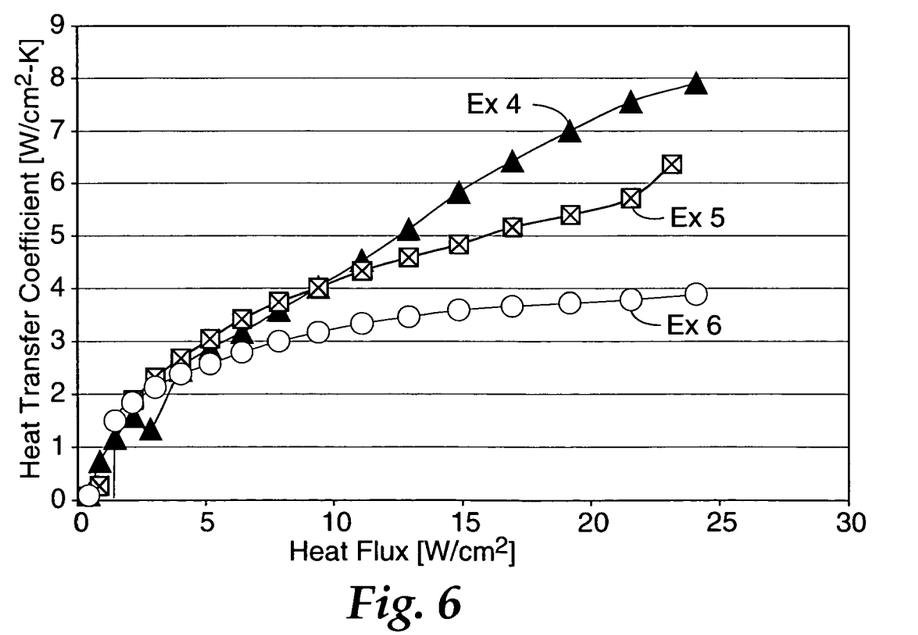
Figure 7:
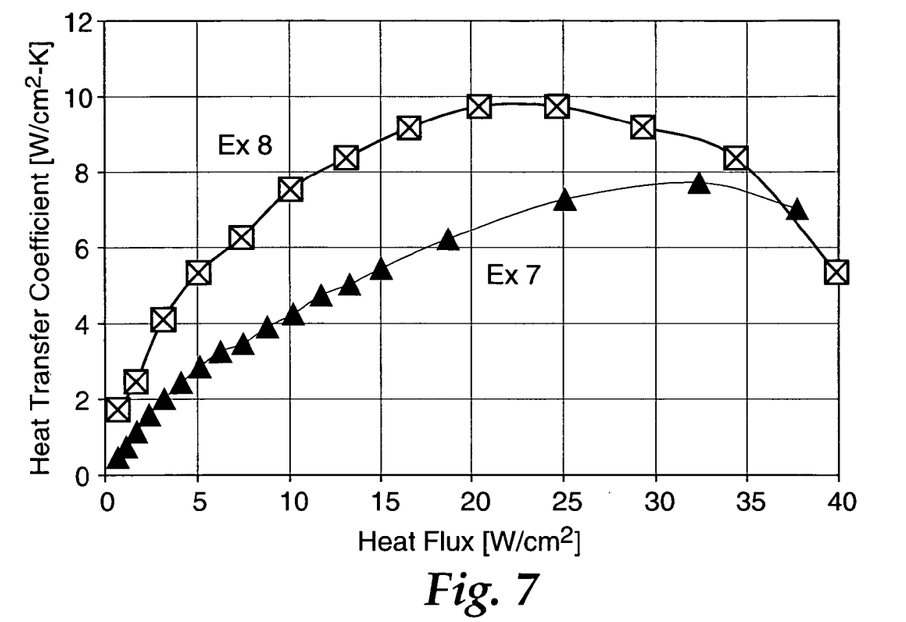

Examples 1-9 were prepared and tested as described above. The coating material, coating process and test method used are outlined in Table 1. The heat transfer coefficient versus heat flux for examples 1-8 were measured with 3M NOVEC HFE-7000 as the working fluid. The results are shown in FIGS. 5-7.

TABLE 1

| Example | Coating Material | Coating Thickness (micrometers) | Test Method |
|---|---|---|---|
| 1 | C | 250 | Pool Boiling 1 |
| 2 | D | 190 | Pool Boiling 1 |
| 3 | E | 310 | Pool Boiling 1 |
| 4 | 10% B, 90% A | 270 | Pool Boiling 1 |
| 5 | 25% B, 75% A | 240 | Pool Boiling 1 |
| 6 | 90% B, 10% A | 300 | Pool Boiling 1 |
| 7 | D | — | Pool Boiling 2 |
| 8 | F | — | Pool Boiling 2 |
| 9 | E | — | Two Phase Forced Convection |

While the aforementioned thermal transfer coatings were typically able to dissipate 30-45 Watts per square centimeter before reaching CHF, the heat exchanger in example 9 was able to dissipate 89 Watts per square centimeter with 30 centimeter of liquid head applied to the inlet.

It is to be understood that even in the numerous characteristics and advantages of the thermal transfer coatings of the present disclosure set forth in the above description and examples, together with details of the structure and function of the thermal transfer coatings, the disclosure is illustrative only. Changes can be made to detail, especially in matters of shape and size of the metal bodies and methods of use within the principles of the present disclosure to the full extent indicated by the meaning of the terms in which the appended claims are expressed and the equivalents of those structures and methods.

What is claimed is:

1. A thermal transfer coating on a substrate, comprising:
a plurality of metal bodies on the substrate, the metal bodies comprising an inner portion comprising a first metal selected from the group consisting of aluminum, copper, silver, and alloys thereof and an outer portion comprising an alloy comprising the first metal and a second metal selected from the group consisting of copper, silver, and magnesium, wherein said first metal and said second metal are different; and
a plurality of interstitial elements disposed between and connecting said plurality of metal bodies to one another, said interstitial elements comprising said alloy of said outer portion;
wherein said thermal transfer coating has an effective porosity of at least 10 percent.

2. The thermal transfer coating of claim 1 wherein said first metal comprises copper and said second metal comprises silver.

3. The thermal transfer coating of claim 1 wherein said first metal is copper and said interstitial element comprises an alloy of silver and copper.

4. The thermal transfer coating of claim 1 wherein said first metal comprises aluminum and said second metal comprises magnesium.

5. The thermal transfer coating of claim 1 wherein said first metal is aluminum and said interstitial element comprises an alloy of aluminum and magnesium.

6. The thermal transfer coating of claim 1 wherein said inner portion further comprises diamond.

7. The thermal transfer coating of claim 6 wherein said diamond comprises an intermediate coating comprising a carbide former selected from the group consisting of chromium, cobalt, manganese, molybdenum, nickel, silicon, tantalum, titanium, tungsten, vanadium, zirconium, and alloys thereof.

8. The thermal transfer coating of claim 1 wherein said plurality of metal bodies have a unit density in the range of $10^7$ to $10^9$ metal bodies per cubic centimeter.

9. The thermal transfer coating of claim 1 wherein said metal bodies are substantially spherical.

10. The thermal transfer coating of claim 9 wherein said metal bodies comprise an average diameter in the range of 5 to 50 micrometers.

11. The thermal transfer coating of claim 1 wherein said metal bodies comprises an aspect ratio in the range of 1 to 2.

12. The thermal transfer coating of claim 1 wherein said coating comprises a thickness in the range of 20 to 500 micrometers.

13. The thermal transfer coating of claim 1 wherein said thermal transfer coating has an effective porosity of at least 20 percent.

14. A cooling system comprising the thermal transfer coating of claim 1.

15. A method of cooling a heat-dissipating device comprising:
providing a heat dissipating device having an outer surface comprising the thermal transfer coating on the substrate of claim 1; and
contacting said thermal transfer coating with a cooling fluid.

16. The method of claim 15 wherein said method comprises single phase heat transfer.

17. The method of claim 15 wherein said method comprise two phase heat transfer.

18. The method of claim 17 wherein said cooling fluid is contained within a thermosyphon.

19. The method of claim 15 further comprising affixing said substrate to said heat-generating device.

20. A thermal transfer coating on a substrate, comprising:
a plurality of composite bodies on the substrate, the composite bodies comprising an inner portion comprising diamond and a first metal selected from the group consisting of aluminum, copper, silver, and alloys thereof, and an outer portion comprising an alloy comprising the first metal and a second metal selected from the group consisting of copper, silver, and magnesium, wherein said first metal and said second metal are different; and a plurality of interstitial elements disposed between and connecting said plurality of metal bodies to one another, said interstitial elements comprising said alloy of said outer portion.

21. The thermal transfer coating of claim 20 wherein said first metal comprises copper and said second metal comprises silver.

22. The thermal transfer coating of claim 20 wherein said first metal is copper and said interstitial element comprises an alloy of silver and copper.

23. The thermal transfer coating of claim 20 wherein said first metal comprises aluminum and said second metal comprises magnesium.

24. The thermal transfer coating of claim 20 wherein said first metal is aluminum and said interstitial element comprises an alloy of aluminum and magnesium.

25. The thermal transfer coating of claim 20 wherein said plurality of metal bodies have a unit density in the range of $10^7$ to $10^9$ metal bodies per cubic centimeter.

26. The thermal transfer coating of claim 20 further comprising an intermediate coating affixed to said diamond comprising a carbide former selected from the group consisting of chromium, cobalt, manganese, molybdenum, nickel, silicon, tantalum, titanium, tungsten, vanadium, zirconium, and alloys thereof, wherein said first metal is affixed to said intermediate coating.

27. The thermal transfer coating of claim 20 wherein said metal bodies are cubo-octohedral.

28. The thermal transfer coating of claim 20 wherein said metal bodies comprises an aspect ratio in the range of 1 to 2.

29. The thermal transfer coating of claim 20 wherein said metal bodies comprise an average diameter in the range of 5 to 50 micrometers.

30. The thermal transfer coating of claim 20 wherein said coating comprises a thickness in the range of 20 to 500 micrometers.

31. The thermal transfer coating of claim 20 wherein said thermal transfer coating has an effective porosity of at least 10 percent.

32. A cooling system comprising the thermal transfer coating of claim 20.

33. A method of coating a heat-dissipating substrate comprising:

providing a heat-dissipating substrate having an outer surface;

depositing a composition comprising a binder and a plurality of metal bodies onto said heat-dissipating substrate, said metal bodies comprising an inner portion comprising a first metal having a melting temperature $T_{mp1}$, and an outer portion comprising a second metal having a melting temperature $T_{mp2}$; and heating said composition to a temperature less than $T_{mp1}$ and $T_{mp2}$ to form an alloy comprising said first metal and said second metal that bonds said plurality of metal bodies to one another and said heat-dissipating substrate, wherein said plurality of metal bodies and said alloy form a porous matrix having an effective porosity of at least 10 percent.

34. The method of claim 33 wherein said first metal is selected from the group consisting of aluminum, copper, silver, and alloys thereof.

35. The method of claim 33 wherein said second metal is the group consisting of copper, silver, magnesium, and alloys thereof.

36. The method of claim 33 wherein said first metal comprises copper and said second metal comprises silver.

37. The method of claim 33 wherein said binder is selected from the group consisting of mineral oil, silicone oil, kerosene, and polyvinyl butyral.

38. The method claim 33 wherein said metal bodies further comprise diamond.

39. The method of claim 33 wherein said outer surface of said heat-dissipating substrate comprises a three-dimensional surface.

\* \* \* \* \*